(12) United States Patent
Matsuda (10) Patent No.: US 8,846,520 B2
(45) Date of Patent: Sep. 30, 2014

(54) SEMICONDUCTOR DEVICE AND METHOD FOR MANUFACTURING SEMICONDUCTOR DEVICE

(71) Applicant: Sumitome Electric Device Innovations, Inc., Yokohama (JP)

(72) Inventor: Keita Matsuda, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 208 days.

(21) Appl. No.: 13/630,171

(22) Filed: Sep. 28, 2012

(65) Prior Publication Data

US 2013/0075906 A1  Mar. 28, 2013

(30) Foreign Application Priority Data

Sep. 28, 2011 (JP) ................. 2011-212873

(51) Int. Cl.
*H01L 21/44* (2006.01)
*H01L 23/00* (2006.01)

(52) U.S. Cl.
CPC ....... *H01L 24/03* (2013.01); *H01L 2224/05558* (2013.01); *H01L 2924/01029* (2013.01); *H01L 2224/13007* (2013.01); *H01L 2224/03464* (2013.01); *H01L 2224/05573* (2013.01); *H01L 2224/05015* (2013.01); *H01L 24/05* (2013.01); *H01L 2224/05557* (2013.01); *H01L 2224/03848* (2013.01); *H01L 24/13* (2013.01); *H01L 2224/05155* (2013.01); *H01L 24/11* (2013.01); *H01L 2224/05562* (2013.01); *H01L 2224/05572* (2013.01); *H01L 2224/05552* (2013.01); *H01L 2224/05644* (2013.01); *H01L 2224/05639* (2013.01); *H01L 2224/05555* (2013.01); *H01L 2224/05017* (2013.01); *H01L 2224/05144* (2013.01); *H01L 2224/13111* (2013.01); *H01L 2224/03552* (2013.01); *H01L 2224/05027* (2013.01); *H01L 2224/05147* (2013.01); *H01L 2224/05018* (2013.01); *H01L 2224/05005* (2013.01)
USPC .......................................... 438/613; 257/738

(58) Field of Classification Search
CPC ............... H01L 2924/1078; H01L 2924/1079; H01L 2924/01029; H01L 2924/01013; H01L 2924/14
USPC .................. 257/779–781, 784, 786, 737–738
See application file for complete search history.

(56) References Cited

U.S. PATENT DOCUMENTS

2011/0193223 A1* 8/2011 Ozaki et al. ................... 257/737

FOREIGN PATENT DOCUMENTS

JP  2000-353763 A  12/2000

* cited by examiner

*Primary Examiner* — Hoa B Trinh
(74) *Attorney, Agent, or Firm* — Westerman, Hattori, Daniels & Adrian, LLP (57) ABSTRACT

A semiconductor device includes: a foundation layer that is provided on a substrate and is electrically conductive; a nickel layer provided on the foundation layer; and a solder provided on the nickel layer, the nickel layer having a first region on a side of the foundation layer and a second region on a side of the solder, the second region being harder than the first region.

17 Claims, 9 Drawing Sheets

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority of the prior Japanese Patent Application No. 2011-212873, filed on Sep. 28, 2011, the entire contents of which are incorporated herein by reference.

BACKGROUND (i) Technical Field

The present invention relates to a semiconductor device and a method for manufacturing a semiconductor device.

(ii) Related Art

Recently, a CSP (Chip Size Package) is being used in order to downsize a semiconductor device. The CSP is flip-chip mounted on a printed circuit or the like with use of a solder ball. When a current is applied to the semiconductor device via the solder ball, the solder may diffuse into a foundation layer acting as an interconnection line. In this case, an electrical open or an electrical short may occur, and the semiconductor device may be broken. In order to restrain the diffusion of the solder, an anti-diffusion layer may be used. Japanese Patent Application Publication No. 2000-353763 discloses a method in which a layer having a thickness of approximately 70 μm and formed with a copper is formed on a resin, and a solder ball is formed on the Cu layer. The Cu layer acts as the anti-diffusion layer.

SUMMARY

It is an object to provide a semiconductor device and a method for manufacturing a semiconductor device restraining diffusion of a solder and restraining stress with low cost.

According to an aspect of the present invention, there is provided a semiconductor device including: a foundation layer that is provided on a substrate and is electrically conductive; a nickel layer provided on the foundation layer; and a solder provided on the nickel layer, the nickel layer having a first region on a side of the foundation layer and a second region on a side of the solder, the second region being harder than the first region.

According to an aspect of the present invention, there is provided a method for manufacturing a semiconductor device including: forming a foundation layer on a substrate; providing a nickel layer, of which upper face side is harder than lower face side, on the foundation layer; and providing a solder on the nickel layer.

DETAILED DESCRIPTION

When the anti-diffusion layer formed with Cu is thick, the number of processes may increase and a cost may increase. Further, variability of in-plane evenness may increase. When the anti-diffusion layer is thin, it is difficult to sufficiently restrain the diffusion of the solder.

A description will be given of a best mode for carrying the present invention.

Figure 1A:
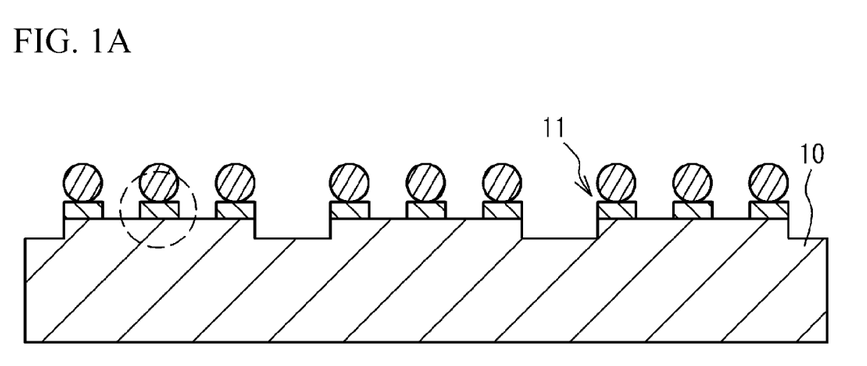
FIG. 1A illustrates a cross sectional view of a semiconductor device in accordance with a first embodiment.
Figure 1B:
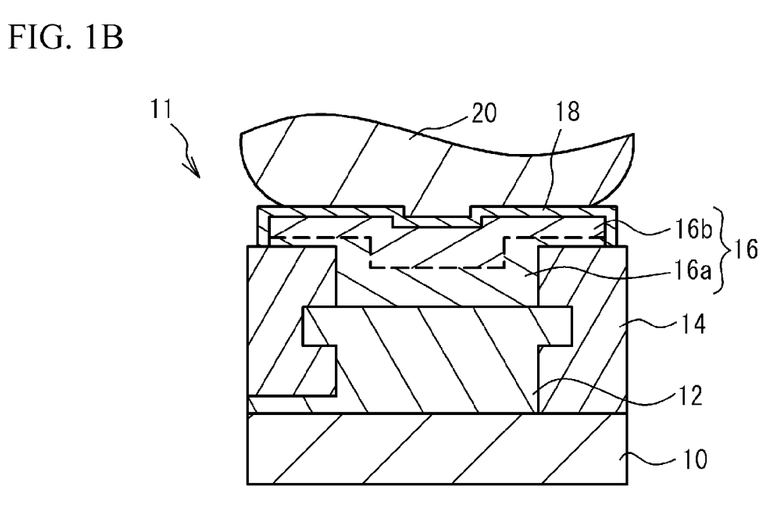
FIG. 1B illustrates an enlarged view of a region around an electrode.

FIG. 1A illustrates a cross sectional view of a semiconductor device in accordance with a first embodiment. FIG. 1B illustrates an enlarged view around an electrode. A thickness of layers in the cross sectional view is schematically illustrated.

In FIG. 1A, a wafer-shaped semiconductor device before dividing is illustrated. As illustrated in FIG. 1A, the semiconductor device of the first embodiment has a substrate 10 and an electrode 11. An insulating layer may be provided between the electrodes 11 adjacent to each other. The substrate 10 is a semiconductor substrate having an insulating substrate such as silicon (Si), silicon carbide (SiC) or a sapphire and nitride semiconductor that is epitaxially grown on the insulating substrate.

FIG. 1B illustrates an enlarged view of a region surrounded by a broken line of FIG. 1A. The electrode 11 includes a foundation layer 12, a nickel (Ni) layer 16, a cover layer 18 and a solder ball 20. The foundation layer 12 is, for example, formed with gold (Au) having a thickness of 5 μm to 10 μm and is provided on the substrate 10. An insulating layer 14 is, for example, a lamination layer in which a silicon nitride (SiN) layer, a silicon oxide ($SiO_2$) layer, or a polyimide layer is laminated, and is provided on the substrate 10 and the foundation layer 12. The foundation layer 12 is exposed through an opening formed in the insulating layer 14. The Ni layer 16 is provided on the exposed region of the foundation layer 12 and on the insulating layer 14. As sectioned by a broken line in FIG. 1B, one region of the Ni layer 16 on the side of the foundation layer 12 is referred to as a first region 16a, and the other region of the Ni layer 16 on the side of the solder ball 20 is referred to as a second region 16b. A thickness of the first region 16a and the second region 16b is, for example, 0.1 μm or more to 5 μm or less. The cover layer 18 is, for example, formed with a metal such as Au having a thickness of 30 nm, is provided between the Ni layer 16 and the solder ball 20, and covers an upper face and a side face of the Ni layer 16. The solder ball 20 is, for example, formed with a solder (Sn—Ag—Cu based solder) mainly including tin, silver and copper, and is provided on the cover layer 18. The foundation layer 12 is contacting with the upper face of a substrate layer of the substrate 10. The Ni layer 16 is contacting with the upper face of the foundation layer 12. The cover layer 18 is contacting with the upper face and the side face of the Ni layer 16. The solder ball 20 is contacting with the upper face of the cover layer 18. The Ni layer 16 acts as an UBM (Under Bump Metal) restraining diffusion of the solder from the solder ball 20. The foundation layer 12 acts as a foundation of the electrode 11 and an interconnection layer. The cover layer 18 acts as a protection layer restraining oxidation of the Ni layer 16. The solder ball 20 acts as an outer connection terminal coupling the semiconductor device with an outer mount substrate.

Figure 2A:
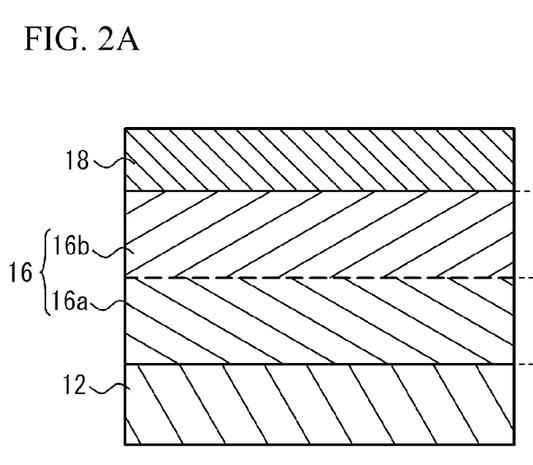
FIG. 2A illustrates a schematic view of an electrode of the first embodiment.
Figure 2B:
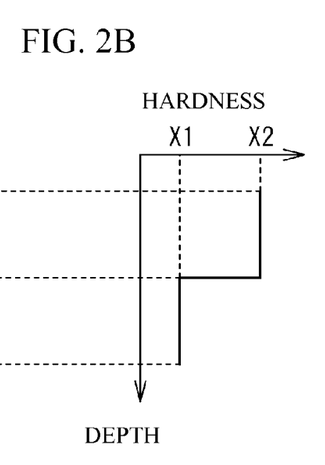
FIG. 2B illustrates a graph illustrating hardness of a nickel layer.

A description will be given of details of a structure of the Ni layer 16. FIG. 2A illustrates a schematic view of the electrode of the first embodiment. FIG. 2B is a graph illustrating hardness of the Ni layer 16. A horizontal axis of FIG. 2B indicates the hardness. A vertical axis of FIG. 2B indicates a depth from the upper face of the cover layer 18.

As illustrated in FIG. 2A and FIG. 2B, the Ni layer 16 is formed by an electroless plating method and includes the first region 16a and the second region 16b having different hardness. The second region 16b is harder than the first region 16a. The hardness is changed in stages between the soft first region 16a and the hard second region 16b. The hardness X1 of the first region 16a is, for example, 150 Hv or more and less than 500 Hv. The hardness X2 of the second region 16b is, for example, 500 Hv or more to 1000 Hv or less. The hardness of pure Ni is approximately 150 Hv. Generally, the hardness of the Ni formed by the electroless plating method is approximately 500 Hv.

The second region 16b is hardened in order to restrain the diffusion reaction of the solder from the solder ball 20 to the foundation layer 12. However, when a layer gets harder, stress gets larger. When the first region 16a is softer than the second region 16b, the stress of the second region 16b is suppressed. In the first embodiment, the second region 16b restrains the open or the short caused by the diffusion of the solder, and the first region 16a restrains a crack of the electrode 11 and the semiconductor substrate 10 caused by the stress of the second region 16b. And, in the first embodiment, the Ni layer 16 restrains the crack of the solder ball 20 caused by thermal expansion coefficients of a chip and a mount substrate, compared to a case where a single layer having the same thickness as the Ni layer 16 and formed with hard Ni is provided. This is because it is difficult for the single hard Ni layer to suppress the stress of the solder ball 20. On the other hand, the stress of the solder ball 20 is suppressed when the single Ni layer is soft. However, in this case, it is difficult to restrain the diffusion of the solder. The upper limit of the hardness of the first region 16a may be 450 Hv, 400 Hv, 300 Hv or the like. The hardness of the second region 16b may be 550 Hv to 950 Hv, 600 Hv to 900 Hv or the like. Preferably, difference of the hardness between the first region 16a and the second region 16b may be 100 Hv or more. In the first embodiment, the Ni layer 16 is denser than another Ni layer formed by an electrolytic plating method, a vapor deposition method or the like, because the Ni layer 16 is formed by the electroless plating method. Therefore, the diffusion of the solder is effectively restrained.

Generally, when the thickness of the UBM gets larger, the stress gets larger. The Ni layer 16 is, for example, a thin layer having a thickness of 0.2 μm to 10 μm. Therefore, the stress of the Ni layer 16 may be reduced. And, the cost gets lower. The thickness of the first region 16a and the second region 16b may be 0.2 μm or more to 4.8 μm or less, and may be more than 0.1 μm and less than 5 μm. The thickness of the first region 16a may be the same as that of the second region 16b, and may be different from that of the second region 16b.

Figure 3A:
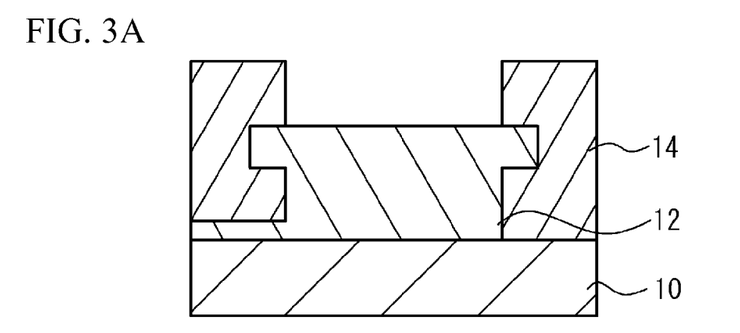
FIG. 3A through FIG. 3C illustrate a cross sectional view of a method for manufacturing the semiconductor device of the first embodiment.
Figure 3B:
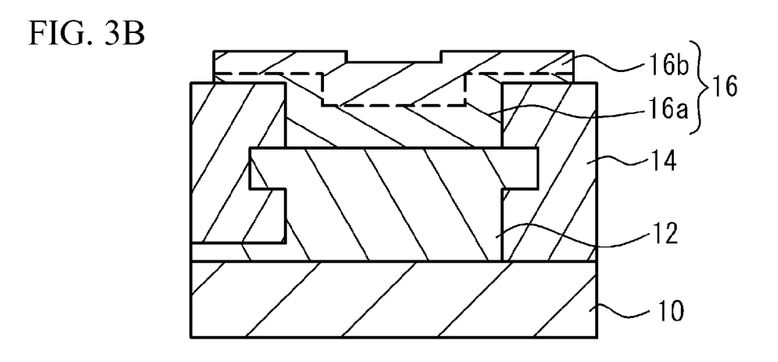
Figure 3C:
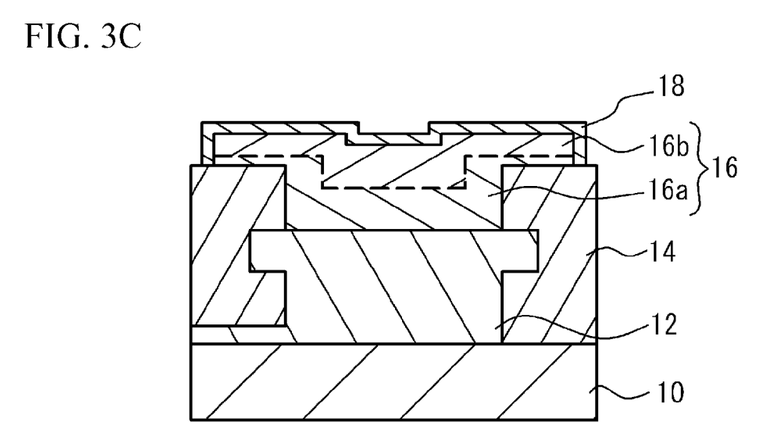

Next, a description will be given of a method for manufacturing the semiconductor device of the first embodiment. FIG. 3A through FIG. 3C illustrate a cross sectional view illustrating the method for manufacturing the semiconductor device in accordance with the first embodiment.

As illustrated in FIG. 3A, the foundation layer 12 is formed on the substrate 10 by the electroless plating method or the like. Then, the insulating layer 14 is formed, and the opening is formed in the insulating layer 14. As illustrated in FIG. 3B, the Ni layer 16 is formed on the foundation layer 12 by the electroless plating method. Nickel electroless plating solution (hereinafter referred to as plating solution) includes a Ni ion and hypophosphorous or hypophosphite. Two types of plating equipment having different types of the plating solution are used, and the first region 16a and the second region 16b are formed. The details are described later.

As illustrated in FIG. 3C, the cover layer 18 is formed by the electroless plating method or the like. The solder ball 20 is formed on the cover layer 18 by a printing method or a reflow method. With the processes, the semiconductor device illustrated in FIG. 1A is manufactured. Further, the substrate 10 is cut off and is divided into chips. Next, a description will be given of the composition of the plating solution.

Figure 4:
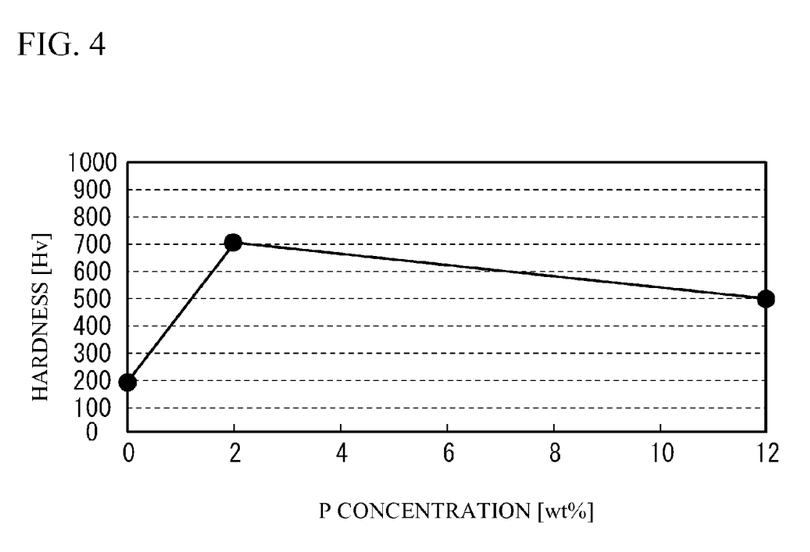
FIG. 4 illustrates a graph illustrating a relation between a P concentration and hardness.

FIG. 4 illustrates a graph of a relation between a P concentration and the hardness. A horizontal axis indicates the P (phosphorous) concentration of the plating solution used in the electroless plating method. A vertical axis indicates the hardness of the Ni layer 16. As illustrated in FIG. 4, when the P concentration is 0 wt %, the hardness is approximately 200 Hv. When the P concentration is 2 wt %, the hardness is approximately 700 Hv. When the P concentration is 12 wt %, the hardness is approximately 500 Hv. In order to form the first region 16a and the second region 16b in the Ni layer, the P concentration has only to be changed in a range of 0 wt % to 15 wt %. In order to form the first region 16a having the hardness of 150 Hv or more and less than 500 Hv, the P concentration of the plating solution has only to be 0 wt % or more to 1 wt % or less, or more than 12 wt %. The P concentration may be less than 1 wt % or more than 12 wt %. In order to form the second region 16b having the hardness of 500 Hv or more, the P concentration of the plating solution has only to be 1 wt % or more to 12 wt % or less. In order to enhance the hardness of the second region 16b, the P concentration may be 1.5 wt % or more to 10 wt % or less.

The solder of the solder ball 20 may be Sn—Cu based solder, Sn—Ag based solder, tin silver bismuth (Sn—Ag—Bi) based solder, or tin zinc (Sn—Zn) based solder or the like. It is preferable that the solder does not include lead (Pb) in view of environmental protection. The foundation layer 12 may be formed with a metal such as Cu or aluminum (Al) other than Au. The foundation layer 12 may be formed with an alloy including at least one of Au, Cu and Al. A material of the cover layer 18 may be a metal such as Ag other than Au.

The nitride semiconductor of the semiconductor layer is semiconductor including nitrogen such as gallium nitride (GaN), aluminum nitride (AlN), aluminum gallium nitride (AlGaN), indium aluminum nitride (InAlN), indium gallium nitride (InGaN), indium nitride (InN), or aluminum indium gallium nitride (AlInGaN). The material of the semiconductor layer may be gallium arsenic (GaAs) or the like other than the nitride semiconductor. The substrate 10 may be a Si substrate, a substrate in which silicon germanium (SiGe) substrate is laminated on a Si substrate, a substrate in which a GaAs-based semiconductor is laminated on a GaAs substrate, a substrate in which an InP-based semiconductor is laminated on an indium phosphide (InP) substrate, or the like. The semiconductor device may be a CSP acting as a FET (Field Effect Transistor), a HBT (Hetero junction Bipolar Transistor), a MMIC (Monolithic Microwave Integrated Circuit), a LED (Light Emitting Diode), a LD (Laser Diode), a TFT (Thin Film Transistor) used for a liquid crystal or the like.

[Second Embodiment]

Figure 5A:
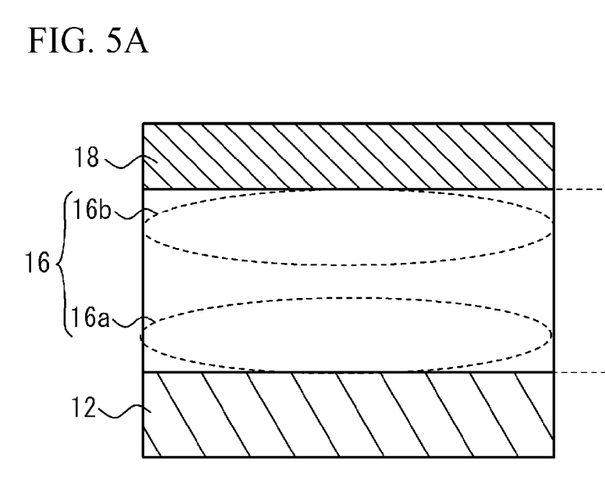
FIG. 5A illustrates a schematic view of an electrode of a second embodiment.
Figure 5B:
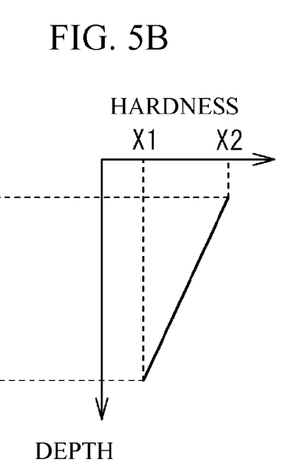
FIG. 5B illustrates a graph illustrating hardness of a nickel layer.

A second embodiment is an embodiment in which the hardness of the Ni layer 16 changes continuously. FIG. 5A illustrates a schematic view of an electrode of the second embodiment. FIG. 5B illustrates a graph of the hardness of the Ni layer. In FIG. 5A, hatchings of the Ni layer 16 are omitted, and the first region 16a and the second region 16b are schematically illustrated by dotted ellipses.

As illustrated in FIG. 5A and FIG. 5B, the hardness of the Ni layer 16 continuously gets higher from the foundation layer 12 side to the solder ball 20 side. The hardness X1 of the lower face of the Ni layer 16 is, for example, 150 Hv and less than 500 Hv. The hardness X2 of the upper face of the Ni layer 16 is, for example, 500 Hv or more to 1000 Hv or less. In accordance with the second embodiment, the low cost is achieved, the diffusion of the solder is restrained, and the stress is restrained, as well as the first embodiment. There is no region of which hardness drastically changes in the Ni layer 16. Therefore, the peeling of the Ni layer 16 at an interface between regions having different hardness is restrained.

Next, a description will be given of a method for manufacturing the semiconductor device in accordance with the second embodiment. FIG. 3A through FIG. 3C are also in common with the second embodiment. The plating solution is the same as the first embodiment. The P concentration is constant. The temperature of the plating solution is continuously changed from 30 degrees C. to 80 degrees C. in the electroless plating method for forming the Ni layer 16. At the starting point of the electroless plating method, the temperature of the plating solution is low about 30 degrees C. Thus, the soft first region 16a is formed. After that, the temperature is gradually increased. The temperature of the plating solution is high about 80 degrees C. in the latter half of the electroless plating method. Thus, doping of P into the Ni layer 16 is promoted. Thus, the hard second region 16b is formed. The rest processes are the same as the first embodiment. The temperature of the plating solution may be 20 to 70 degrees C., 40 to 90 degrees C. or the like other than 30 to 80 degrees C.

[Third Embodiment]

Figure 6A:
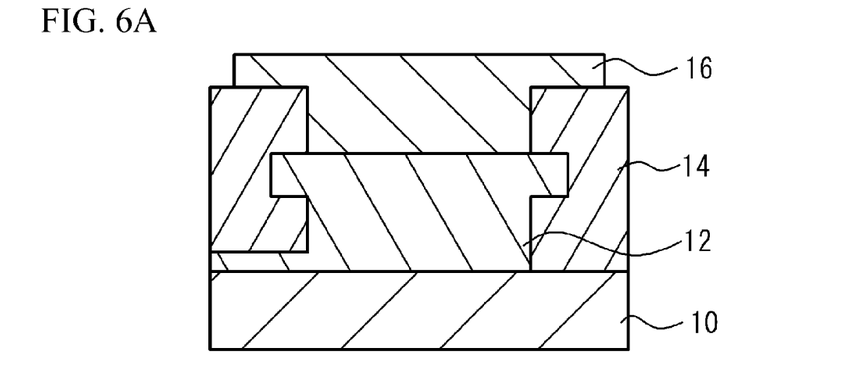
FIG. 6A through FIG. 6C illustrate a cross sectional view illustrating a method for manufacturing a semiconductor device in accordance with a third embodiment.
Figure 6B:
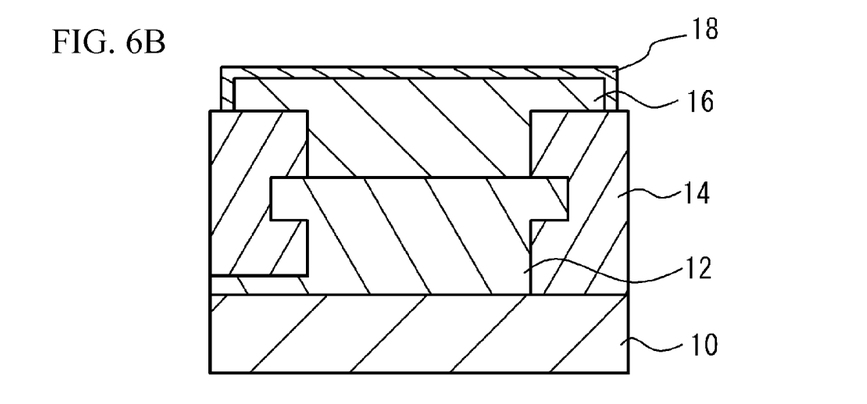
Figure 6C:
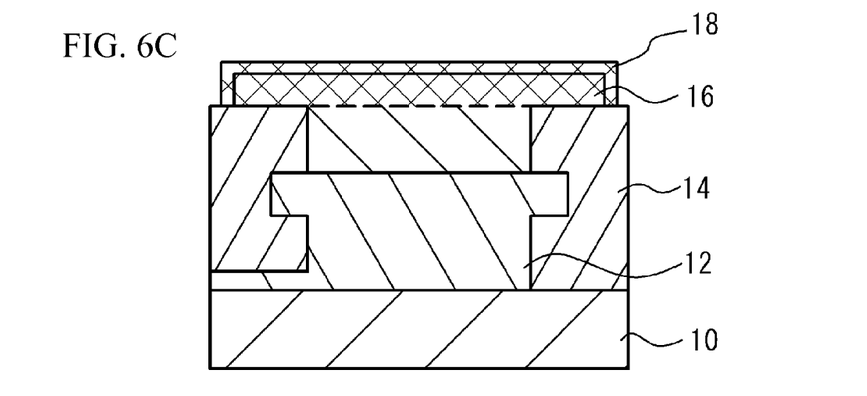

A third embodiment is an embodiment in which a heat treatment is performed in the process for forming the Ni layer. FIG. 6A through FIG. 6C illustrate a cross sectional view of a method for manufacturing a semiconductor device in accordance with the third embodiment.

As illustrated in FIG. 6A, the Ni layer 16 is formed on the foundation layer 12. The plating solution of the third embodiment is the same as the first embodiment. The P concentration is constant. Therefore, the hardness of the Ni layer 16 after the electroless plating is even regardless of regions of the Ni layer 16, and is, for example, approximately 100 Hv to 500 Hv. As illustrated in FIG. 6B, the cover layer 18 is formed on the Ni layer 16. An upper face of a wafer is subjected to a laser light scanning, or the laser light is radiated to the upper face of the wafer as a whole. Thus, as illustrated with meshed lines in FIG. 6C, a region of the Ni layer 16 near the upper face thereof and the cover layer 18 are heated to 350 degrees C. An excimer laser, a YAG (Yttrium Aluminum garnet) laser or the like is used as the laser light source. A laser annealing is performed in an atmosphere including an inert gas such as a hydrogen ($H_2$) gas, a nitrogen ($N_2$) gas or an argon (Ar) gas and air. The hard second region 16b is formed in the Ni layer 16 through the laser annealing. The heat is continuously conducted from the upper face to the lower face of the Ni layer 16. And, the hardness of the Ni layer 16 continuously changes as illustrated in FIG. 5B. The processes after the laser annealing are the same as the first embodiment.

When the heat treatment temperature is 300 degrees C. to 500 degrees C., the hardness of the second region 16b is over 800 Hv. When the heat treatment temperature is around 400 degrees C., the hardness increases to 900 Hv to 1000 Hv. In order to achieve preferable hardness, the heat treatment temperature is adjusted between 100 degrees C. to 600 degrees C. In order to harden the second region 16b more, it is preferable that the heat treatment temperature is 200 degrees C. to 500 degrees C., 300 degrees C. to 450 degrees C., or the like. In order to keep the hardness of the first region 16a low and harden the second region 16b more, it is preferable that the region of the Ni layer 16 near the upper face thereof is intensively subjected to the heat treatment for a short time such as one second. The laser annealing is preferable as the heat treatment method. And the degradation of the semiconductor is restrained and the efficiency of the manufacturing processes is improved, because the treatment time is short. In the case of the laser annealing, the heat treatment temperature and the radiation time may be changed when the output of the laser, the beam scanning speed, and the pulse width are adjusted.

The changing of the P concentration of the first embodiment, the changing of the plating temperature of the second embodiment, and the heat treatment of the third embodiment may be combined. For example, the P concentration of the plating solution may be changed, and the temperature may be changed continuously. For example, the second region 16b is hardened more, when the Ni layer 16 is formed by changing the P concentration continuously, and the Ni layer 16 is subjected to the laser annealing. In particular, it is preferable that the heat treatment is performed, in order to achieve the hardness of 1000 Hv. The plating solution may include a Ni ion, dimethylamine-borane and gluconic acid, or dimethylamineborate and gluconate. In this case, it is possible to adjust the hardness of the Ni layer 16 by adjusting the concentration of boron (B), changing the temperature of the plating solution, or the heat treatment.

[Fourth Embodiment]

Figure 7A:
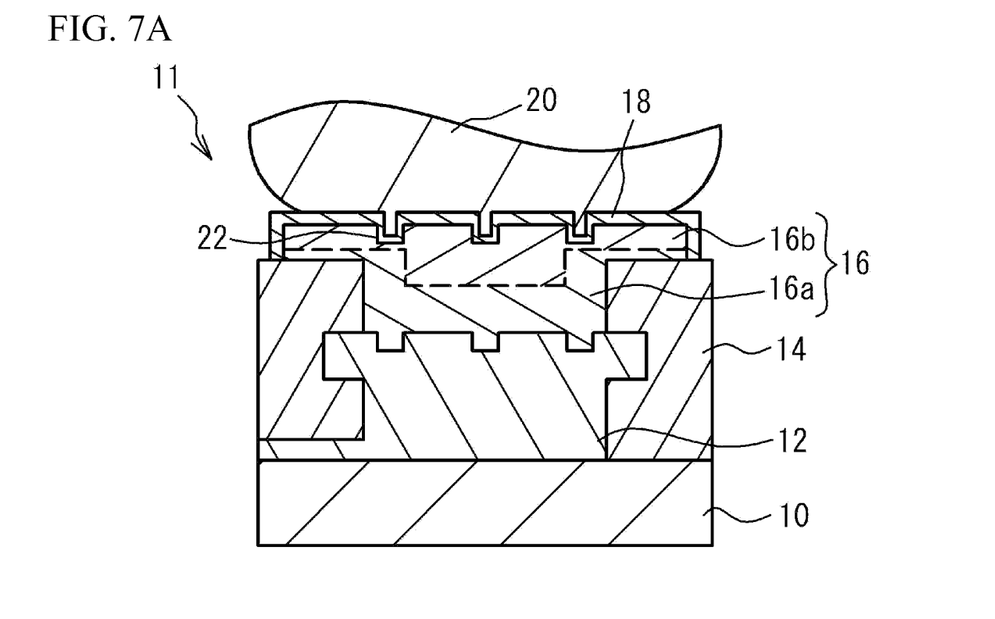
FIG. 7A illustrates an enlarged view around an electrode of the fourth embodiment.
Figure 7B:
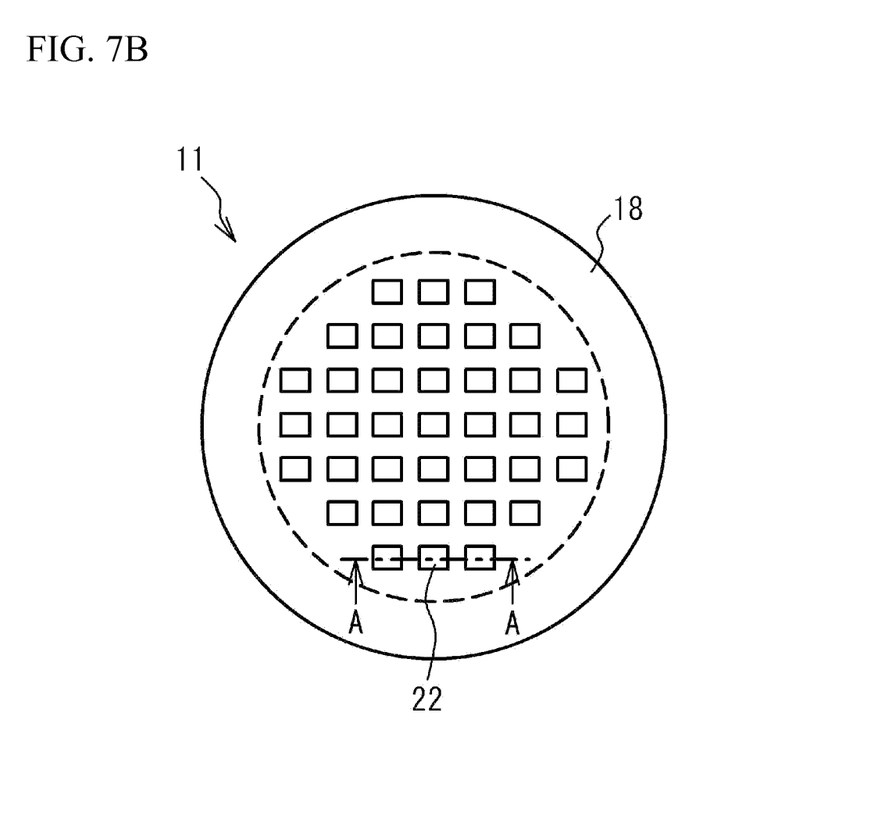
FIG. 7B illustrates a plane view of the electrode.

A fourth embodiment is an embodiment in which concavity and convexity is formed on the upper face of the Ni layer 16. FIG. 7A illustrates an enlarged view around the electrode of the fourth embodiment, and illustrates a cross sectional view taken along a line A-A of FIG. 7B. FIG. 7B illustrates a plane view of the electrode. In FIG. 7B, the solder ball 20 is seen through. A region surrounded by a broken line circle is a region where the solder ball 20 is jointed.

As illustrated in FIG. 7A, the concavity and convexity is formed on the upper face of the foundation layer 12. And concavity and convexity is formed on a surface of the Ni layer 16 according to the concavity and convexity of the foundation layer 12. The cover layer 18 is formed along the concavity and convexity of the Ni layer 16. Concavity and convexity is formed on a surface of the cover layer 18 according to the concavity and convexity of the Ni layer 16. The solder ball 20 is provided so as to contact with the concavity and convexity of the cover layer 18. The depth of a concave portion 22 of the Ni layer 16 is, for example, 0.5 µm to 10 µm. As illustrated in FIG. 7B, the surface of the Ni layer 16 has a waffle structure in which a plurality of the concave portions 22 are distributed. A surface area of the foundation layer 12 and a surface area of the Ni layer 16 are enlarged because of the concavity and convexity. Thus, stress concentration to a small region is restrained. Therefore, even if a diameter of the electrode 11 is reduced, the stress can be restrained. Further, anchor effect enhances jointing strength between the foundation layer 12 and the Ni layer 16, between the Ni layer 16 and the cover layer 18, and between the cover layer 18 and the solder ball 20. Thus, reliability of mounting is improved.

Figure 8A:
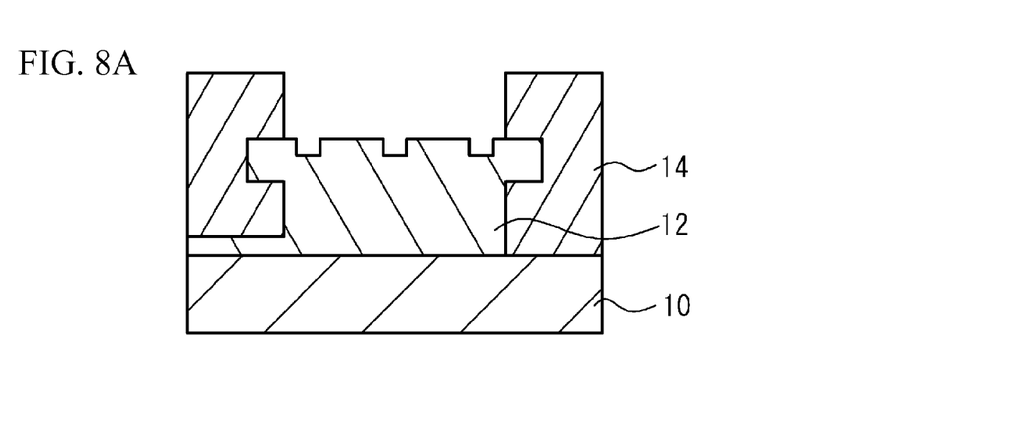
FIG. 8A through FIG. 8C illustrate a cross sectional view of a method for manufacturing a semiconductor device of the fourth embodiment.
Figure 8B:
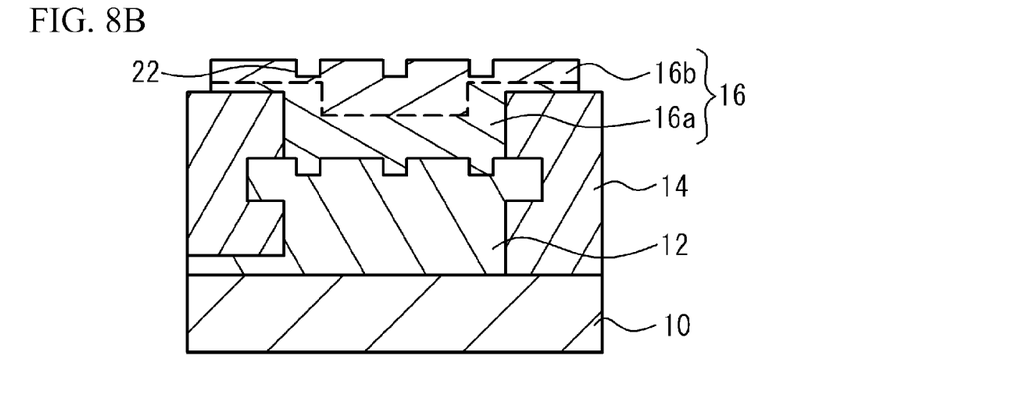
Figure 8C:
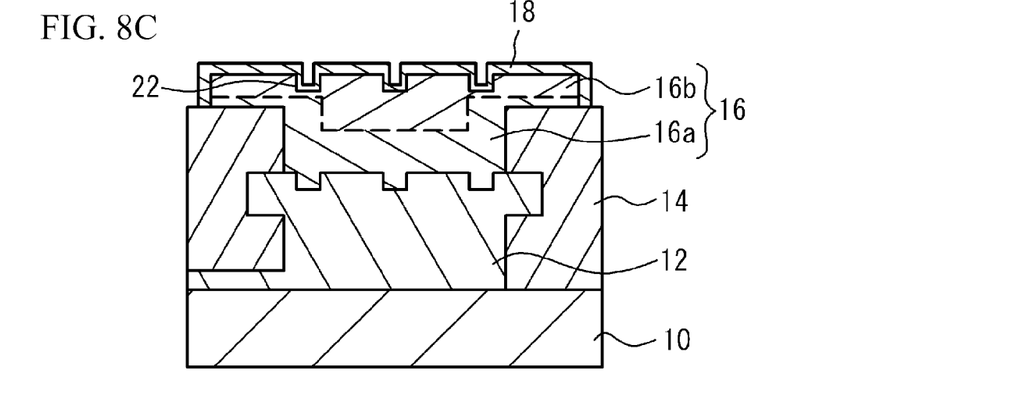

Next, a description will be given of a method for manufacturing a semiconductor device in accordance with the fourth embodiment. FIG. 8A through FIG. 8C illustrate a cross sectional view of the method for manufacturing the semiconductor device of the fourth embodiment. An explanation of the same processes as the first embodiment is omitted.

As illustrated in FIG. 8A, after forming the foundation layer 12, the concavity and convexity are formed on the upper face of the foundation layer 12 by an etching method or the like. The concavity and convexity may be formed before or after forming the insulating layer 14. As illustrated in FIG. 8B, the Ni layer 16 is formed by the electroless plating method. Thus, the concavity and convexity are formed on the surface of the Ni layer 16 according to the concavity and convexity of the foundation layer 12. Here, the hardness of the first region 16a and the second region 16b is adjusted by changing the P concentration as well as the first embodiment. As illustrated in FIG. 8C, the cover layer 18 is formed along the concavity and convexity of the Ni layer 16 by a vapor deposition method or a sputtering method. The concavity and convexity are filled with molten solder through a reflow process, and the solder ball 20 is formed. The concavity and convexity may be directly formed on the surface of the Ni layer 16 and the surface of the cover layer 18 other than the upper face of the foundation layer 12.

Figure 9:
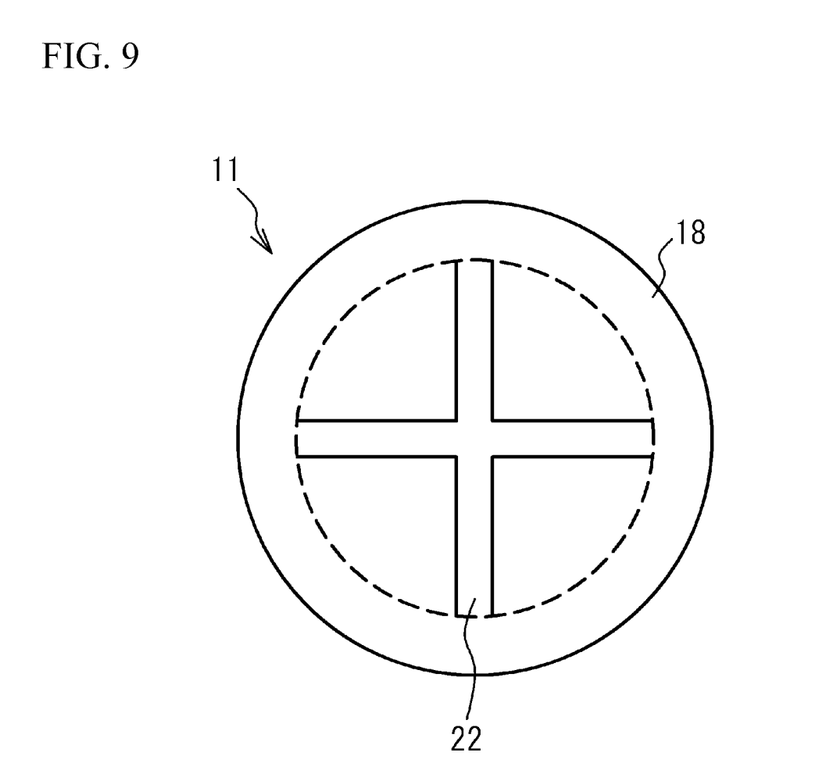
FIG. 9 illustrates a plane view of an electrode of a modified embodiment.

Next, a description will be given of a modified embodiment of the fourth embodiment. FIG. 9 illustrates a plane view of an electrode of the modified embodiment. As illustrated in FIG. 9, the surface of the Ni layer 16 may have a structure in which the concave portions 22 are arrayed in a cross shape. The number and the alignment of the concave portions 22 may be changed. In the fourth embodiment, one of the changing of the P concentration, the changing of the temperature of the plating solution, and the heat treatment may be applied. And, two or more of the changing of the P concentration, the changing of the temperature of the plating solution, and the heat treatment may be combined.

The present invention is not limited to the specifically disclosed embodiments and variations but may include other embodiments and variations without departing from the scope of the present invention.

What is claimed is:

1. A semiconductor device comprising:
   a foundation layer that is provided on a substrate and is electrically conductive;
   a nickel layer provided on the foundation layer; and
   a solder provided on the nickel layer,
   the nickel layer having a first region on a side of the foundation layer and a second region on a side of the solder, the second region being harder than the first region.

2. The semiconductor device as claimed in claim 1, wherein:
   hardness of the first region is 150 Hv or more and less than 500 Hv; and
   hardness of the second region is 500 Hv or more to 1000 Hv or less.

3. The semiconductor device as claimed in claim 2, wherein difference of hardness between the first region and the second region is 100 Hv or more.

4. The semiconductor device as claimed in claim 1, wherein the solder is a solder ball.

5. The semiconductor device as claimed in claim 1, wherein the hardness of the nickel layer changes in stages from the first region to the second region.

6. The semiconductor device as claimed in claim 1, wherein the hardness of the nickel layer continuously changes from the first region to the second region.

7. The semiconductor device as claimed in claim 1, wherein a thickness of the first region and the second region is 0.1 µm or more to 5 µm or less.

8. The semiconductor device as claimed in claim 1, wherein the foundation layer includes at least one of gold, copper and aluminum.

9. The semiconductor device as claimed in claim 1 further comprising a cover layer located between the nickel layer and the solder.

10. The semiconductor device as claimed in claim 9, wherein the cover layer covers an upper face and a side face of the nickel layer.

11. The semiconductor device as claimed in claim 9, wherein the cover layer is gold or silver.

12. The semiconductor device as claimed in claim 9, wherein:
   concavity and convexity is formed on a surface of the nickel layer; and
   concavity and convexity is formed on a surface of the cover layer according to the concavity and convexity of the nickel layer.

13. A method for manufacturing a semiconductor device comprising:
   forming a foundation layer on a substrate;
   providing a nickel layer, of which upper face side is harder than lower face side, on the foundation layer; and
   providing a solder on the nickel layer.

14. The method as claimed in claim 13, wherein the nickel layer is formed by an electroless plating method in which a concentration of phosphorous in a growing of the upper face side of the nickel layer is lower than that in a growing of the lower face side of the nickel layer.

15. The method as claimed in claim 13, wherein the nickel layer is formed by a heat treatment in which a temperature of the upper face side of the nickel layer is higher than that of the lower face side of the nickel layer, after forming the nickel layer.

16. The method as claimed in claim 15, wherein the heat treatment is a laser annealing.

17. The method as claimed in claim 13, wherein the nickel layer is formed by an electroless plating method in which a temperature of the upper face side of the nickel layer is higher than that of the lower face side of the nickel layer.

* * * * *

UNITED STATES PATENT AND TRADEMARK OFFICE
CERTIFICATE OF CORRECTION

PATENT NO. : 8,846,520 B2
APPLICATION NO. : 13/630171
DATED : September 30, 2014
INVENTOR(S) : Keita Matsuda It is certified that error appears in the above-identified patent and that said Letters Patent is hereby corrected as shown below:

On the title page item (71)
Change (71) Applicant: "Sumitome Electric Device Innovations, Inc., Yokohama (JP)"

To be (71) Applicant: --Sumitomo Electric Device Innovations, Inc., Yokohama (JP)--

Signed and Sealed this
Third Day of February, 2015

Michelle K. Lee
*Deputy Director of the United States Patent and Trademark Office*